United States Patent [19]

Vader et al.

[11] Patent Number: 5,463,872

[45] Date of Patent: Nov. 7, 1995

[54] HIGH PERFORMANCE THERMAL INTERFACE FOR LOW TEMPERATURE ELECTRONIC MODULES

[75] Inventors: David T. Vader, Mechanicsburg, Pa.; Vincent C. Vasile, Marlboro, N.Y.

[73] Assignee: International Business Machines Corporation, Armonk, N.Y.

[21] Appl. No.: 303,254

[22] Filed: Sep. 8, 1994

[51] Int. Cl.[6] .................................................. F25B 19/00
[52] U.S. Cl. .......................... 62/51.1; 62/64; 62/259.2; 361/700; 165/80.4
[58] Field of Search .............................. 62/64, 62, 259.2, 62/51.1; 361/699, 700; 165/80.4

[56] References Cited

U.S. PATENT DOCUMENTS

| | | | |
|---|---|---|---|
| 3,725,566 | 4/1973 | Plizak | 62/64 X |
| 4,395,728 | 7/1983 | Li | 165/80.4 X |
| 4,647,338 | 3/1987 | Visser | 156/643 |
| 4,800,422 | 1/1989 | Sanwo | 357/82 |
| 4,802,345 | 2/1989 | Curtis | 62/51.1 |
| 4,928,207 | 5/1990 | Chrysler et al. | 361/700 |
| 5,050,114 | 9/1991 | Lee | 364/578 |
| 5,121,292 | 6/1992 | Bell et al. | 361/700 |
| 5,142,443 | 8/1992 | Moore, Jr. | 361/700 |
| 5,193,349 | 3/1993 | Laverman et al. | 62/64 |
| 5,223,747 | 6/1993 | Tschvlena | 361/700 X |
| 5,305,184 | 4/1994 | Andresen et al. | 62/259.2 X |
| 5,323,293 | 6/1994 | Angiulli et al. | 62/259.2 X |
| 5,349,499 | 9/1994 | Yamada et al. | 62/259.2 X |

*Primary Examiner*—Christopher Kilner
*Attorney, Agent, or Firm*—Lily Neff; Lawrence D. Cutter

[57] ABSTRACT

A device and method for cryogenic cooling of electronic components. A mixture of a first non-condensible gas and a second condensible gas is provided within an insulative housing. The non-condensible gas mixture has a partial pressure equal to the desired saturation pressure of the condensible gas. The insulative housing also includes an immersion chamber for housing electronic components. The immersion chamber preferably comprises two retainer parts and provides an module retainer top and a lower coldplate retainer bottom. The module retainer top allows gas to pass through the module retainer portion freely. The condensible gas is then turned into liquid form by a provided condensing means. The condensed liquid thus forms and collects inside the immersion chamber against the coldplate retainer bottom to cool the electronic components placed within. The non-condensible gas permits the condensed liquid to be subcooled.

14 Claims, 2 Drawing Sheets

HIGH PERFORMANCE THERMAL INTERFACE FOR LOW TEMPERATURE ELECTRONIC MODULES

FIELD OF INVENTION

The present invention pertains to a method and device for cryogenic cooling of electronic components by introduction of a liquid at thermal interfaces.

BACKGROUND OF THE INVENTION

Cryocooled computers are being used increasingly due to their improved performance. In these computers certain logic components are cryogenically cooled to increase the speed of operation. It is well known in the art to cool these logic components by placing them in direct contact with a cryocooler cold head which is insulated from the external environment usually by being placed in a vacuum vessel. However, it is extremely difficult to maintain the extremely low cryogenic temperatures.

Liquid nitrogen immersion cooling has been widely anticipated for the future. The liquid nitrogen immersion cooling method, provides for a cooling scheme in which a multi-chip module is cooled by direct contact with the cold head, instead of using a cold head of a cryogenic refrigerator to condense nitrogen and achieve low temperatures. This cooling scheme, however, requires a low resistance chip-to-cold plate thermal interface in order to achieve the desired chip operating temperatures. A key problem which still remains is material resiliency which is known to decrease sharply at low temperatures, leaving uncertainty as to the reliability of the thermal joint. If the interface compound should become brittle, for example, thermal stresses can result in cracking and/or separation from the chip or cold plate surfaces causing the joint to fail.

Therefore it is very important to provide mechanical compliance between the chips and the cooling hardware. Today, it is known in the art to insure compliance by placing a piston-like structure that can translate and tilt in a hole over each chip to achieve intimate contact with the back of the chip. Heat that is conducted into the piston is subsequently dissipated through a water or air cooled cold plate. Another mechanical approach that has been used is the radial finger. However, good thermal performance of the chip piston and chip-radial finger interfaces, will only be achieved if the interface is immersed in a media of sufficiently high thermal conductivity and density.

Reduced thermal interface conductance can be achieved at room temperature with helium gas. However, a helium flooded chip-piston interface performs poorly at cryogenic temperatures because the thermal conductivity of helium is much lower at those temperatures than at room temperature.

In addition if a vacuum vessel is used, the added problem of internal pressure controls have to be resolved. Furthermore, the use of a vacuum vessel also adds the problem of passing any electrical cable connected to the components through the sealed vessel.

U.S. Pat. No. 5,121,292 seems to disclose a cryogenic field-replaceable logic unit for use with a cryogenic cold head. In one embodiment, liquid nitrogen is used for immersion cooling of the chips and carrier placed in a vacuum sealed vessel. This embodiment uses a recess to hold a pool of liquid cryocoolant. However, there are no teachings or suggestions of a method using two separate mixtures of condensible and non-condensible gases with the pressure of the non-condensible gas having a partial pressure equal to the desired saturation pressure of the condensible gas as described in the present invention.

U.S. Pat. No. 4,800,422 apparently discloses a double walled vessel having a styrofoam filling between the double walls internally supporting a semiconductor circuit to which a cable ribbon is attached. It seems then that an electrical cable pass-through is produced between the insulated portions of cryogenic cooler used for VLSI testing. There are no teachings or suggestions of a cooling method comprising a mixture of gases above a liquid pool above a cryogenically cooled module or an improved cold plate design as suggested in the present invention.

U.S. Pat. No. 5,142,443 apparently teaches a mounting arrangement for electronic circuit chips in which at least one chip is mounted upon an appropriately electrically insulative chip plate. However, there are no teachings or suggestions of a method using two separate mixtures of condensible and non-condensible gases with pressure with the non-condensible gas having a partial pressure equal to the desired saturation pressure of the condensible gas as described in the present invention.

U.S. Pat. No. 5,050,114 appears to teach a method for predicting the optimum operating conditions for a two-phase liquid cooling environment using simulation software. There are no teachings or suggestions of cryogenic cooling of electronic components using mixtures of two distinct gases.

U.S. Pat. No. 4,647,338 apparently discloses a method of manufacturing through which the partial pressure of a condensible gas in a mixture is maintained with another gas. There are no teachings or suggestions, however, of an improved method of cooling electronic components using a mixture of gases above a liquid pool of cryogenically cooled liquid, or an improved cold plate design as suggested in the present invention.

SUMMARY OF THE INVENTION

Accordingly, it is an object of the present invention to provide a method and a device for enhancing interface performance at cryogenic temperatures.

Another object of the present invention is to provide mechanical compliance between chips and cooling hardware in a computer system.

A further object of the present invention is to keep a liquid condensate in a subcooled state.

This invention relates to a method and device for cryogenic cooling of electronic components. A sealable housing is provided which contains a gas mixture of a first non-condensible gas and a second condensible gas. The non-condensible gas mixture has a partial pressure equal to saturation pressure of the condensible gas. The insulated housing also includes an immersion chamber with a cavity which separates the two parts of a retainer which also houses the electronic components to be cooled in the aforementioned cavity.

The immersion chamber separates the upper module retainer portion from a coldplate bottom. Means are provided on the module retainer portion to allow the gas mixtures to pass through the module retainer portion freely. The condensible gas is then turned into liquid form by condensing means, the condensed liquid collecting inside the immersion chamber's cavity against the coldplate to cool the electronic components placed within.

BRIEF DESCRIPTION OF THE DRAWINGS

The subject matter which is regarded as the invention is particularly pointed out and distinctly claimed in the concluding portion of the specification. The invention, however, both as to organization and method of practice, together with the further objects and advantages thereof, may best be understood by reference to the following description taken in connection with the accompanying drawings in which:

DETAILED DESCRIPTION OF THE INVENTION

The present invention permits the introduction of a liquid at thermal interfaces to enhance heat transfer performance at cryogenic temperatures. The cryogenic liquid results from the introduction of a gas, at the time of room temperature assembly of the sealed housing, which gas later condenses on, and thereby wets the chilled chip and cooling hardware surfaces in the sealed housing. Important to this approach, however, is the ability to hold the condensate in a subcooled state, which means the saturation temperature of the liquid will be kept above the chip temperature. Saturated liquid will boil when heated at the chip surfaces, which could lead to dryout of thermal interfaces, accompanied by a precipitous increase in the thermal interface resistance.

Figure 1:
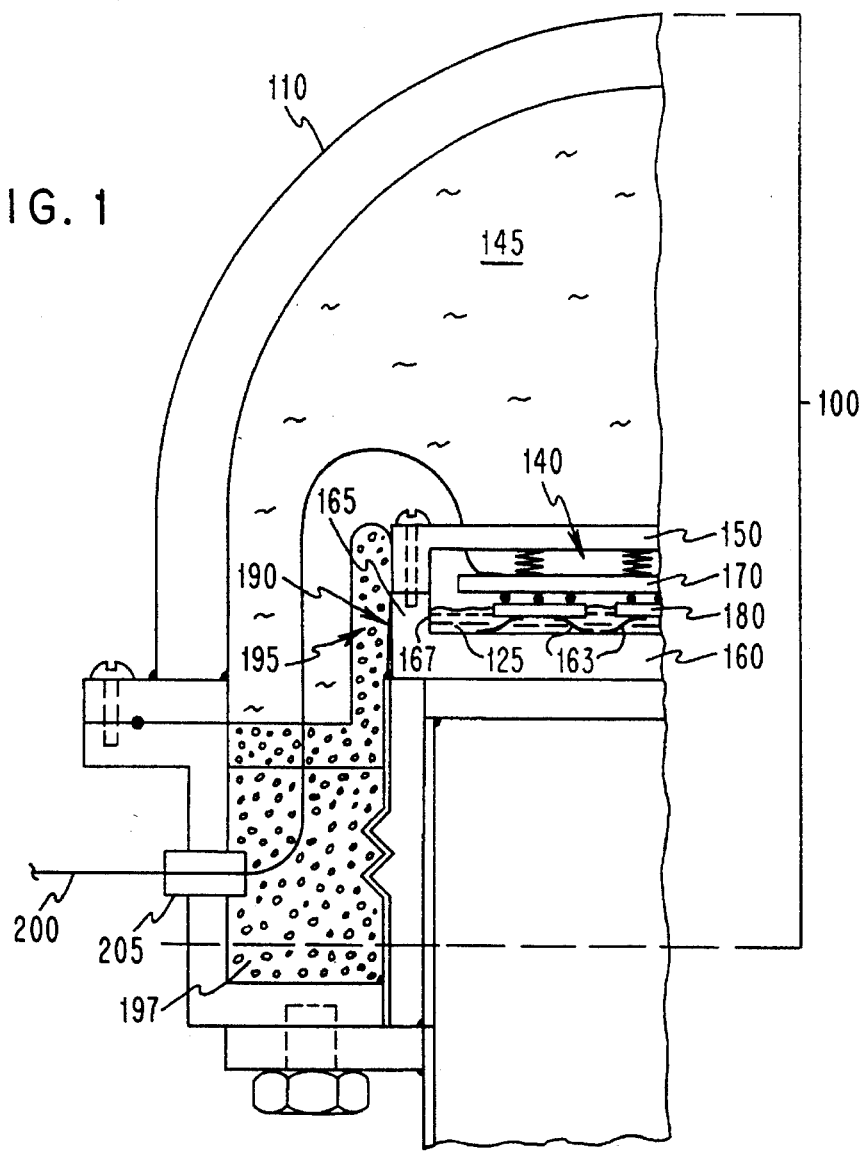
FIG. 1 illustrates a cross sectional, side elevation view of an embodiment of the present invention.

FIG. 1 illustrates one embodiment of the present invention. The sealed housing 100 includes an insulated dome 110, preferably vacuum sealed. The insulated dome 110 at least partially defines cavity 145 containing the immersion chamber 140 which houses module 170 containing chips or other electronic components 180 to be cooled.

Subcooled liquid wetting of electronic components 180 on module 170 is achieved by filling cavity 145 with a mixture of a condensible gas, for example argon, and a non-condensible gas like helium. The mixture is such that the partial pressure of the helium equals the desired argon saturation pressure.

Immersion chamber 140 is at least partially defined by module retainer top 150 and coldplate bottom 160. Flow communication means are provided in the module retainer top 150 to allow the gas mixture in cavity 145 to pass through module retainer top 150 freely. Condensible gas from cavity 145 condenses into liquid form on the chilled surfaces of coldplate bottom 160 and the condensed liquid 125 collects inside the cavity 145 against the coldplate bottom 160 to cool the electronic components 180 placed therein.

Insulative material 195 is also used to inhibit condensation on exterior surfaces of finned cold plate 160 so that the condensate will form only on surfaces interior to tray 167. Insulative material 197 is also introduced to the base section of enclosure, since the enclosure walls are not vacuum insulated at this point so as to permit electrical pass-through 205 by means of an electric cable 200.

In one example, when a 105K saturation temperature is desired, resulting in 5K of subcooling for 100K chips. The saturation pressure and the helium partial pressure is 68.8 psia. When the components 180 are cooled to 100K, nearly all of the argon condenses on the chilled surfaces of coldplate bottom 160 thereby wetting the electronic components as desired. Since, however, the helium is non-condensible at these temperatures, the pressure in cavity 145 can only fall to the helium's partial pressure of 68.8 psia at 105K, and the argon is subcooled to the desired 5K temperature.

Figure 2:
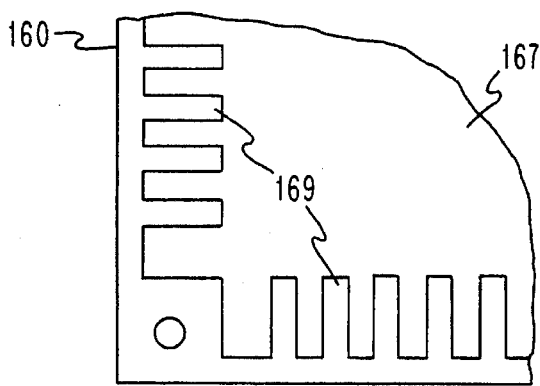
FIG. 2 is a top view illustrating a finned cold plate having a fin arrangement in accordance with one of the embodiments of the present invention.

The present invention also introduces an improved coldplate having lip 165 and fins 169 which are shown in detail in FIG. 2. Lip 165 forms tray 167 to retain condensate 125 and to insure that thermal contact interfaces, for example radial fingers 163, are wetted by the liquid condensate 125. Furthermore, fins 169 serve to facilitate condensation process, and to channel the condensate 125 into tray 167.

One challenge in introducing the gas mixture in cavity 145 is that prior to cooling electronic component module 170, the pressure within immersion chamber 140 is proportional to its temperature. A worse case assumption is that the helium is uniformly cooled to cryogenic temperatures, which could result in a three-fold helium pressure reduction. The argon will condense at low temperatures, and will therefor have a small impact on the low temperature pressure. The argon, however, is introduced as a gas at room temperature, which will further increase the internal pressure prior to cooling to operating temperatures. The amount of argon that must be introduced, and the resulting pressure increase, will increase in proportion to the need for argon condensate in reservoir 125.

Figure 3:
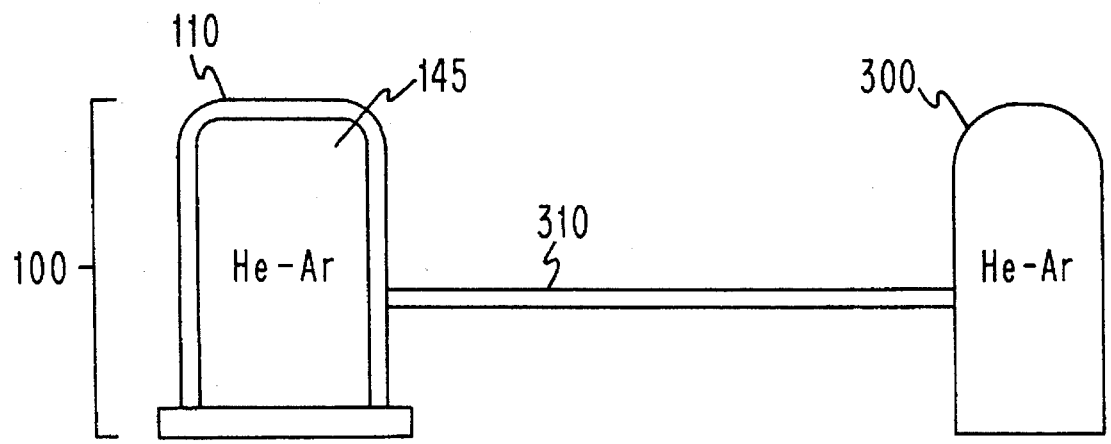
FIG. 3 is a side elevation view of an alternate embodiment of the present invention utilizing a remote gas volume.

The challenge of these high internal pressures prior to chilling module 170 is alleviated by connecting the sealed housing 100 to a second remote gas volume 300 also containing a helium-argon mixture as shown in FIG. 3. This second remote gas volume 300 could be, for example, in the form of a gas cylinder. The two gas volumes are then connected via a small diameter tube 310 which provides thermal isolation of the remote gas volume, while permitting the gas mix to flow freely between the two volumes. As argon in cavity 145 condenses, additional argon will flow into the cavity 145 due both to bulk flow of the gas mixture and diffusion from the region of higher argon concentration in remote gas volume 300. Since the total gas volume is increased, the effect of adding the needed amount of argon gas at room temperature and pressure is reduced. Furthermore, the remote gas volume 300 remains at room temperature, and thereby imposes the room temperature pressure on the cold gas in the sealed housing. The cavity's pressures at room temperatures then would only be marginally higher at room temperatures, both due to phase change of the argon, and thermal expansion of the gas mixture, than when cryogenic temperatures are imposed.

Figure 4:
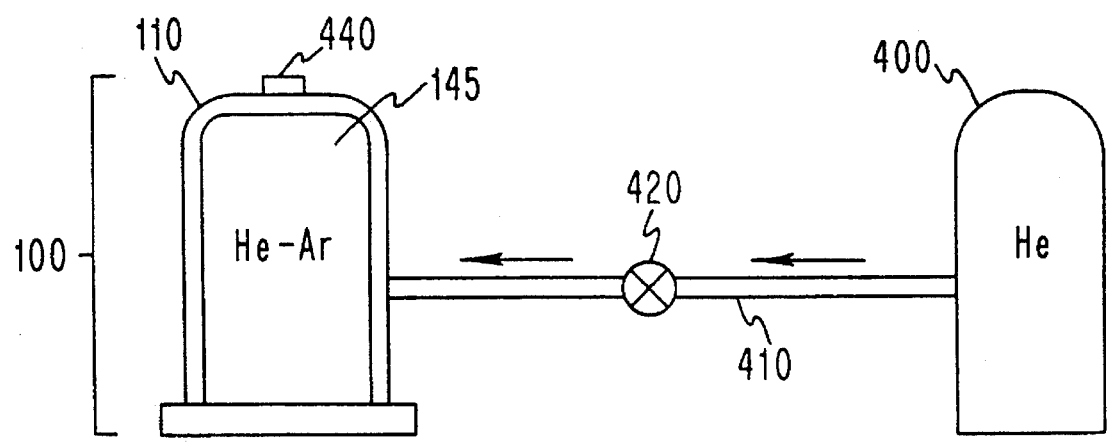
FIG. 4 is a side elevation view of a second alternate embodiment of the present invention utilizing a remote helium supply.

Another embodiment of the present invention, as shown in FIG. 4, permits even lower maximum gas pressure in the sealed housing 100. In this embodiment, cavity 145 is connected via a small diameter tube 410 to a remote gas volume 400. A low cracking pressure check valve 420, for example with a pressure of ⅓ psia, which permits flow only from remote gas volume 400 into cavity 145 of sealed housing 100, is placed in the connecting tube 410. Cavity 145 is then filled with argon or another condensible gas and remote gas volume 400 is filled with room temperature helium or another non-condensible gas mixture in such a manner that the pressure of argon and helium is equal in both, and exceeds the desired saturation pressure by an amount equal to the check valve 420 cracking pressure. Thus for example, if the desired saturation pressure is 68.6 psia as used above, the new pressure would be 68.6+⅓ psia. The gasses do not mix until module 170 is cooled. As the argon begins to condense and the temperature of helium in the cavity 145 falls to cryogenic temperatures, the pressure in the sealed housing 100 is reduced. When the difference between the module and cylinder pressures is sufficient to open the check valve 420, helium will flow into the cavity 145 and maintains the desired saturation pressure and temperature. When module 170 is returned to room temperature, the expanding gas in sealed housing 100 is discharged through a pressure relief vent 440. This approach requires that sealed housing 100 be recharged with argon prior to restoring cryogenic temperatures, and the second gas volume 400 would need to be replaced, if one is used.

While the invention has been described in detail herein in accordance with certain preferred embodiments thereof, many modifications and changes therein may be effected by those skilled in the art. Accordingly, it is intended by the appended claims to cover all such modifications and changes as fall within the true spirit and scope of the invention.

Having thus described our invention, what we claim as new and desire to secure by Letters Patent is:

1. A cryogenic cooling device for cooling electronic components, said device comprising:

a thermally insulative and sealed housing containing a gas mixture of a first gas and a second gas, said gas mixture being at a pressure equal to the partial pressure of said first gas and to the saturation pressure of said second gas, said first gas being non-condensible and said second gas being condensible within a desired operating temperature range for said electronic components;

an immersion chamber disposed within said insulative housing for holding said electronic components in contact with a condensed phase of said condensible second gas, said chamber being in gaseous flow communication with the interior of said insulative housing; and condensing means in thermal contact with said immersion chamber for condensing said second condensible gas to a liquid form, said condensed liquid collecting in said immersion chamber for cooling said electronic components.

2. The device of claim 1, wherein said insulative housing comprises a vacuum sealed dome holding said gas mixtures; and an insulation portion, partially in contact with said immersion chamber which serves to insulate said device in locations not sealed by said vacuum sealed dome.

3. The device of claim 2, wherein said insulative portion comprises a first insulative material area disposed against an exterior surface of said coldplate bottom whereby liquid condensate forms only within said tray;

a second insulative material area made of same or different material as said first insulative material, disposed under said vacuum sealed dome where said sealed housing is not insulated.

4. The device of claim 3, wherein said second insulative material area includes seal preserving means for allowing an electrical cable to pass through.

5. The device of claim 1, further including protruding radial fingers extending from a wall of said immersion chamber to contact said electronic components.

6. The device of claim 1, further including spring loaded plungers extending from a wall of said immersion chamber to contact said electronic components.

7. The device of claim 1, wherein said condensing means is a cryocooler cold head.

8. The device of claim 1, wherein said immersion chamber includes means for mounting electronic components so as to insure their contact with said condensed phase.

9. The device of claim 1, wherein said immersion chamber separates a module retainer top from a coldplate bottom; and said module retainer top allowing said gas mixture to pass through freely.

10. The device of claim 9, wherein said immersion chamber includes a portion having a lip, said lip forming a tray inside said chamber for holding said condensed phase.

11. The device of claim 10, wherein said coldplate bottom also includes fins, said fins serving to facilitate condensation of said second condensable gas.

12. The device of claim 1, wherein high internal gas mixture pressure prior to condensation is adjusted by connecting said sealed housing to a remote gas means for providing a second gas mixture;

said sealed housing being connected to said remote gas means via a small diameter connecting tube, said connecting tube being thermally isolated;

said second gas mixture being at room temperature and containing said same condensible and non-condensible gases with same pressure as said gas mixture in said cavity so as to impose room temperature pressure at all times even after said gas mixture adjacent to said immersion chamber is cooled; and said connecting tube permitting said two gas mixtures to flow freely between said remote means and said cavity and also allowing said condensible gas from said remote gas means to diffuse into said immersion chamber.

13. The device of claim 1, wherein said sealed housing only contains a condensible gas and lower maximum gas pressures in said sealed housing are attained by connecting said sealed housing via a small diameter connecting tube to a second remote gas means providing a non-condensible gas at room temperature;

a low cracking pressure check valve placed inside said connecting tube, said check valve only allowing flow of said non-condensible gas from said second remote means into said sealed housing;

pressure of said gas mixture and said first non-condensible gas from said second remote gas means being equal at room temperature and exceeding saturation pressure of said condensible gas by an amount equal to said check valve's cracking pressure;

said check valve having an open and a closed position and being in said closed position when said second condensible gas is not yet condensed into liquid form;

said check valve moving into said open position when said liquid condensate is formed causing said gas pressure in said immersion chamber to become different and lower than pressure of said non-condensible gas from said remote gas means;

said sealed housing also having a pressure relief vent for discharging said gas mixture when pressure in said immersion chamber is increased due to rising temperatures expanding said gas mixtures, said gas pressure in said immersion chamber becoming different and greater than pressure of said gas from said remote gas means.

14. A method for cryogenic cooling of electronic components in a computer system, said method comprising the steps of:

enclosing a first non-condensible gas and a second condensible gas in a thermally insulative and sealed housing, said non-condensible gas having partial pressure equal to saturation pressure of said second condensible gas;

providing an immersion chamber within said housing for contacting said electronic components with a condensed phase of said condensible gas; and condensing said condensible gas to a liquid form and collecting said condensed liquid within said immersion chamber.

* * * * *